United States Patent
Sui et al.

(10) Patent No.: US 11,354,462 B2
(45) Date of Patent: Jun. 7, 2022

(54) METHOD AND APPARATUS FOR DETERMINING COPING CAPABILITY BOUNDARY INFORMATION OF AN UNMANNED VEHICLE AND ELECTRONIC DEVICE

(71) Applicant: APOLLO INTELLIGENT DRIVING TECHNOLOGY (BEIJING) CO., LTD., Beijing (CN)

(72) Inventors: Simin Sui, Beijing (CN); Tian Gao, Beijing (CN)

(73) Assignee: APOLLO INTELLIGENT DRIVING TECHNOLOGY (BEIJING) CO., LTD.

( * ) Notice: Subject to any disclaimer, the term of this patent is extended or adjusted under 35 U.S.C. 154(b) by 248 days.

(21) Appl. No.: 16/563,239

(22) Filed: Sep. 6, 2019

(65) Prior Publication Data

US 2020/0019659 A1 Jan. 16, 2020

(30) Foreign Application Priority Data

Oct. 31, 2018 (CN) .......................... 201811283622.4

(51) Int. Cl.
  *G06F 30/20* (2020.01)
  *G05D 1/00* (2006.01)
(52) U.S. Cl.
  CPC .......... *G06F 30/20* (2020.01); *G05D 1/0088* (2013.01)
(58) Field of Classification Search
  CPC .............................. G05D 1/0088; G06F 30/20
  (Continued)

(56) References Cited

U.S. PATENT DOCUMENTS 6,317,666 B1* 11/2001 List ..................... G01M 17/007
  340/576
6,938,466 B2* 9/2005 Bonadies ............ F02D 41/1441
  73/114.73

(Continued)

FOREIGN PATENT DOCUMENTS

CN 101384465 A 3/2009
CN 104821080 A 8/2015

(Continued)

OTHER PUBLICATIONS

Chen et al. (Autonomous Vehicle Testing and Validation Platform: Integrated Simulation System with Hardware in the Loop, IEEE, 2018, pp. 949-956) (Year: 2018).*

(Continued)

*Primary Examiner* — Iftekhar A Khan
(74) *Attorney, Agent, or Firm* — Dilworth IP, LLC

(57) ABSTRACT

The disclosure provides a method and an apparatus for determining coping capability boundary information of an unmanned vehicle and an electronic device. A set of indicator combination for evaluating a coping capability of an unmanned vehicle to be tested in a preset driving scenario is obtained, where the indicator combination includes at least one indicator item and an expected value range of the indicator item; historical driving behavior information of the unmanned vehicle to be tested is obtained according to a scenario feature corresponding to the preset driving scenario and the indicator item; and coping capability boundary information corresponding to the indicator combination of the unmanned vehicle to be tested in the preset driving scenario is obtained according to the historical driving behavior information, which realizes the coping capability boundary of the unmanned vehicle corresponding to the indicator combination that need to be tested.

13 Claims, 5 Drawing Sheets

Obtaining a set of indicator combination, where the indicator combination is used for evaluating a coping capability of an unmanned vehicle to be tested in a preset driving scenario, and where the indicator combination includes at least one indicator item and an expected value range of the indicator item — S101

Obtaining historical driving behavior information of the unmanned vehicle to be tested according to a scenario feature corresponding to the preset driving scenario and the indicator item — S102

Obtaining coping capability boundary information corresponding to the indicator combination, of the unmanned vehicle to be tested in the preset driving scenario, according to the historical driving behavior information — S103

(58) Field of Classification Search
USPC .......................................................... 703/8
See application file for complete search history.

(56) References Cited

U.S. PATENT DOCUMENTS

| | | | | |
|---|---|---|---|---|
| 7,680,639 | B2* | 3/2010 | Schoeggl | G01M 17/007 434/66 |
| 8,296,013 | B2* | 10/2012 | Kuramori | B60W 40/08 701/41 |
| 8,566,028 | B2* | 10/2013 | Bradicich | G01C 21/3617 701/428 |
| 8,718,863 | B2* | 5/2014 | Schoeggl | G01M 17/007 701/33.1 |
| 8,768,616 | B2* | 7/2014 | Kristinsson | G01C 21/3617 701/467 |
| 8,949,016 | B1* | 2/2015 | Ferguson | G01S 17/89 340/436 |
| 9,140,675 | B2* | 9/2015 | Watanabe | G01N 33/0004 |
| 9,347,779 | B1* | 5/2016 | Lynch | G01S 19/393 |
| 9,886,841 | B1* | 2/2018 | Nave | B60W 10/04 |
| 10,035,519 | B2* | 7/2018 | Minster | B60W 40/09 |
| 11,022,971 | B2* | 6/2021 | Della Penna | G06F 8/65 |
| 2004/0236473 | A1* | 11/2004 | Dorey | G01M 17/007 701/1 |
| 2009/0234552 | A1* | 9/2009 | Takeda | G08G 1/167 701/1 |
| 2014/0350777 | A1* | 11/2014 | Kawai | G07C 5/0808 701/32.3 |
| 2015/0134244 | A1* | 5/2015 | Hershey | G01C 21/3617 701/489 |
| 2015/0142205 | A1* | 5/2015 | Harsham | B60W 50/085 701/1 |
| 2016/0025025 | A1* | 1/2016 | Schöggl | G05B 13/042 701/29.1 |
| 2016/0171885 | A1* | 6/2016 | Lynch | G08G 1/096716 701/117 |
| 2017/0250796 | A1* | 8/2017 | Samid | H04L 9/0838 |
| 2018/0013768 | A1* | 1/2018 | Hunt | H04L 63/14 |
| 2018/0113461 | A1* | 4/2018 | Potnis | B60W 50/00 |
| 2018/0127001 | A1* | 5/2018 | Ricci | B60R 25/24 |
| 2018/0136655 | A1* | 5/2018 | Kim | H04W 4/024 |
| 2018/0275657 | A1* | 9/2018 | You | G05B 23/0294 |
| 2019/0042679 | A1* | 2/2019 | Stefan | G06F 30/20 |
| 2019/0163178 | A1* | 5/2019 | Sidle | G01S 13/862 |
| 2019/0258251 | A1* | 8/2019 | Ditty | G06V 20/58 |
| 2019/0310654 | A1* | 10/2019 | Halder | G05D 1/0274 |
| 2020/0088539 | A1* | 3/2020 | Shashua | G06V 20/588 |

FOREIGN PATENT DOCUMENTS

| | | | | |
|---|---|---|---|---|
| CN | 106926840 | A | | 7/2017 |
| CN | 106951627 | A | | 7/2017 |
| CN | 107063711 | A | | 8/2017 |
| CN | 107782564 | A | | 3/2018 |
| CN | 107843440 | A | | 3/2018 |
| CN | 107966724 | A | | 4/2018 |
| CN | 109543245 | A | * 3/2019 ............ G01M 17/06 |
| JP | 5768666 | B2 | | 8/2015 |
| JP | 2015210595 | A | | 11/2015 |
| JP | 2018077827 | A | | 5/2018 |
| WO | 2004102287 | A1 | | 11/2004 |

OTHER PUBLICATIONS

Best et al. ("AutonoVi: Autonomous Vehicle Planning with Dynamic Maneuvers and Traffic Constraints", ArXiv, 2017, pp. 1-9) (Year: 2017).*
González et al. ("A Review of Motion Planning Techniques for Automated Vehicles", IEEE, 2016, pp. 1135-1145) (Year: 2016).*
Pendleton et al. ("Perception, Planning, Control, and Coordination for Autonomous Vehicles", 2017, MDPI, pp. 1-54) (Year: 2017).*
First Office Action in CN Patent Application No. 201811283622.4 dated Nov. 18, 2020.
First Office Action in JP Patent Application No. 2019166091 dated Nov. 24, 2020.
Notice of Allowance in CN Patent Application No. 201811283622.4 dated May 25, 2021.
Shen, Yu et al., Autonomous Vehicle Testing and Validation Platform: Integrated Simulation System with Hardware in the Loop, IEEE, 2018.
European Search Report issued in European Patent Application No. EP19197063 dated Mar. 20, 2020.

* cited by examiner

METHOD AND APPARATUS FOR DETERMINING COPING CAPABILITY BOUNDARY INFORMATION OF AN UNMANNED VEHICLE AND ELECTRONIC DEVICE

CROSS-REFERENCE TO RELATED APPLICATION

The present application claims priority to Chinese application number 201811283622.4, filed on Oct. 31, 2018, which is incorporated by reference in its entirety.

TECHNICAL FIELD

The disclosure relates to the field of vehicle testing technology, and in particular to a method and apparatus for determining coping capability boundary information of an unmanned vehicle and an electronic device.

BACKGROUND

A driverless vehicle, also known as an unmanned vehicle, is an intelligent vehicle that can perform route planning and driving behavior control autonomously. It mainly uses on-board sensors to sense surrounding environment of the vehicle, and autonomously controls the steering and speed of the vehicle according to information about roads, vehicle positions and obstacles obtained by sensing, so that the vehicle can travel safely and reliably on the road and reach an intended target. For various kinds of driving scenarios, unmanned vehicle's preset coping strategies or execution parameters may affect its normality. For example, a vehicle with a certain speed can brake in time in a braking scenario, but there may be an uncontrolled drift in a left-turning scenario for the vehicle with the same driving speed, so in a turning scenario, which it cannot cope with properly, the speed needs to be adjusted. In order to ensure the safety of the unmanned vehicle and various automation performances, in the process of R&D and testing of the unmanned vehicle, or during use, it is necessary to evaluate the coping capability of the vehicle, and judge whether it is necessary to improve corresponding driving information based on the evaluation results.

In the prior art, a method for evaluating and testing an unmanned vehicle mainly evaluates an intelligent level of the unmanned vehicle, for example, determining its intelligence level according to whether the unmanned vehicle can perform route planning and an accuracy of the planning.

However, the existing method for evaluating an unmanned vehicle is relatively general, which can only be a rough assessment of an overall level. It is impossible to conduct a targeted evaluation on a performance that needs to be tested, and R&D personnel cannot determine a direction of improvement for unmanned vehicles based on existing evaluation results of unmanned vehicles. The existing method for evaluating an unmanned vehicle is of low accuracy.

SUMMARY

The disclosure provides a method and apparatus for determining coping capability boundary information of an unmanned vehicle, and an electronic device, which realizes coping capability boundary of the unmanned vehicle corresponding to an indicator combination that needs to be tested, and can find performance defects of the unmanned vehicle flexibly, thereby improving accuracy and pertinence of an unmanned vehicle test.

According to a first aspect of the present disclosure, the present disclosure provides a method for determining coping capability boundary information for an unmanned vehicle, including:

obtaining a set of indicator combination, where the indicator combination is used for evaluating a coping capability of an unmanned vehicle to be tested in a preset driving scenario, and where the indicator combination includes at least one indicator item and an expected value range of the indicator item;

obtaining historical driving behavior information of the unmanned vehicle to be tested according to a scenario feature corresponding to the preset driving scenario and the indicator item; and obtaining coping capability boundary information corresponding to the indicator combination, of the unmanned vehicle to be tested in the preset driving scenario, according to the historical driving behavior information.

In an embodiment, in a possible implementation of the first aspect, obtaining coping capability boundary information corresponding to the indicator combination of the unmanned vehicle to be tested in the preset driving scenario according to the historical driving behavior information, includes:

processing the historical driving behavior information by using a preset autonomous driving simulation algorithm, and obtaining a simulated value corresponding to the indicator item for a plurality of sets of simulated driving behavior information in the preset driving scenario, where the plurality of sets of simulated driving behavior information are driving behavior information including the historical driving behavior information;

determining, according to the simulated value of each of the indicator item and the expected value range, an indicator coping result corresponding to each of the indicator item for the unmanned vehicle to be tested with each of the simulated driving action information, where the indicator coping result is used to indicate whether the simulated value reaches the expected value range; and determining the coping capability boundary information corresponding to the indicator combination, of the unmanned vehicle to be tested in the preset driving scenario, according to the indicator coping result corresponding to each of the indicator item in the indicator combination.

In an embodiment, in another possible implementation of the first aspect, determining coping capability boundary information corresponding to the indicator combination, of the unmanned vehicle to be tested in the preset driving scenario according to the indicator coping result corresponding to each of the indicator item in the indicator combination, includes:

determining a combined coping result corresponding to the indicator combination for the simulated driving behavior information according to the indicator coping result corresponding to each of the indicator item in the indicator combination;

determining a coping capability boundary for the simulated driving behavior information, according to the combined coping result corresponding to the indicator combinations for the simulated driving behavior information, where the coping capability boundary is used to divide the simulated driving behavior information into a first type of simulated driving behavior information corresponding to a combined coping result indicating successful coping, and a second type of simulated driving behavior information corresponding to a combined coping result indicating failed coping; and taking simulated driving behavior information corresponding to the coping capability boundary as the coping capability boundary information corresponding to the indicator combination, of the unmanned vehicle to be tested in the preset driving scenario.

In an embodiment, in yet another possible implementation of the first aspect, determining a coping capability boundary for the simulated driving behavior information, according to the combined coping result corresponding to the indicator combination for the simulated driving behavior information, includes:

determining a first capability boundary for the simulated driving behavior information according to the combined coping result corresponding to the indicator combination for the simulated driving behavior information;

obtaining boundary historical driving behavior information within a preset range of the first capability boundary, from the historical driving behavior information;

obtaining a real coping result corresponding to the boundary historical driving behavior information, where the real coping result indicates a real coping situation correspond to the indicator combinations when the unmanned vehicle applies the boundary historical driving behavior information in the driving scenario;

correcting the first capability boundary with the real coping result to obtain a second capability boundary; and taking the second capability boundary as the coping capability boundary of the unmanned vehicle to be tested.

In an embodiment, in yet another possible implementation of the first aspect, obtaining historical driving behavior information of the unmanned vehicle to be tested according to a scenario feature corresponding to the preset driving scenario and the indicator item, includes:

obtaining pre-stored traveling information of the unmanned vehicle to be tested, where the pre-stored traveling information includes pre-stored driving information and pre-stored environment information corresponding to the pre-stored driving information;

determining pre-stored driving behavior information of the unmanned vehicle to be tested and pre-stored scenario information corresponding to the pre-stored driving behavior information, according to the pre-stored traveling information;

clustering the pre-stored scenario information to obtain at least one scenario feature and the pre-stored driving behavior information corresponding to each of the scenario feature, where the scenario feature is used to indicate a classification feature of the pre-stored scenario information of a same class;

determining a target driving behavior type according to the indicator item; and determining the historical driving behavior information of the unmanned vehicle to be tested from the pre-stored driving behavior information, according to the scenario feature corresponding to the preset driving scenario and the target driving behavior type.

In an embodiment, in yet another possible implementation of the first aspect, before obtaining historical driving behavior information of the unmanned vehicle to be tested according to a scenario feature corresponding to the preset driving scenario and the indicator item, the method further includes:

determining a plurality of indicator items and the scenario feature corresponding to the preset driving scenario, according to a capability type corresponding to the coping capability boundary information to be determined;

determining a set of indicator combination from the plurality of indicator items, where the indicator combination includes at least one of the indicator items.

In an embodiment, in yet another possible implementation of the first aspect, the pre-stored environment information includes timestamp information;

after obtaining coping capability boundary information corresponding to the indicator combination of the unmanned vehicle to be tested in the preset driving scenario according to the historical driving behavior information, the method further includes:

obtaining timestamp information corresponding to the coping capability boundary information, according to the pre-stored environment information corresponding to the historical driving behavior information;

determining, according to the timestamp information corresponding to the coping capability boundary information, period coping capability boundary information of the unmanned vehicle to be tested in a plurality of preset time periods, where the time period indicates a surrounding vegetation growth stage of the preset driving scenario; and comparing the period coping capability boundary information of the unmanned vehicle to be tested in the plurality of preset time periods, and obtaining a coping capability boundary comparison result.

According to a second aspect of the present disclosure, the present disclosure provides an apparatus for determining coping capability boundary information of unmanned vehicles, including:

an obtaining module, configured to obtain a set of indicator combination, where the indicator combination is used for evaluating a coping capability of an unmanned vehicle to be tested in a preset driving scenario, and where the indicator combination includes at least one indicator item and an expected value range of the indicator item;

a value obtaining module, configured to obtain historical driving behavior information of the unmanned vehicle to be tested according to a scenario feature corresponding to the preset driving scenario and the indicator item; and a processing module, configured to obtain coping capability boundary information corresponding to the indicator combination of the unmanned vehicle to be tested in the preset driving scenario according to the historical driving behavior information.

In an embodiment, in a possible implementation of the second aspect, the processing module is specifically configured to:

process the historical driving behavior information by using a preset autonomous driving simulation algorithm, and obtain a simulated value of the indicator item for a plurality of sets of simulated driving behavior information in the preset driving scenario, where the plurality of sets of simulated driving behavior information are driving behavior information including the historical driving behavior information; determine, according to the simulated value corresponding to each of the indicator item and the expected value range, an indicator coping result corresponding to each of the indicator item for the unmanned vehicle to be tested with each of the simulated driving behavior information, where the indicator coping result is used to indicate whether the simulated value reaches the expected value range; and determine the coping capability boundary information corresponding to the indicator combination, of the unmanned vehicle to be tested in the preset driving scenario, according to the indicator coping result corresponding to each of the indicator item in the indicator combination.

In an embodiment, in another possible implementation of the second aspect, the processing module is specifically configured to:

determine a combined coping result corresponding to the indicator combination for the simulated driving behavior information according to the indicator coping result corresponding to each of the indicator item in the indicator combination; determine a coping capability boundary for the simulated driving behavior information according to the combined coping result corresponding to the indicator combination for the simulated driving behavior information, where the coping capability boundary is used to divide the simulated driving behavior information into a first type of simulated driving behavior information corresponding to a combined coping result indicating successful coping, and a second type of simulated driving behavior information corresponding to a combined coping result indicating failed coping; and take the simulated driving behavior information corresponding to the coping capability boundary as the coping capability boundary information corresponding to the indicator combination, of the unmanned vehicle to be tested in the preset driving scenario.

In an embodiment, in yet another possible implementation of the second aspect, the processing module is specifically configured to:

determine a first capability boundary for the simulated driving behavior information according to a combined coping result corresponding to the indicator combination for the simulated driving behavior information; obtain boundary historical driving behavior information within a preset range of the first capability boundary from the historical driving behavior information; obtain a real coping result corresponding to the boundary historical driving behavior information, where the real coping result indicates a real coping situation corresponding to the indicator combination when the unmanned vehicle applies the boundary historical driving behavior information in the driving scenario; correct the first capability boundary with the real coping result to obtain a second capability boundary; and take the second capability boundary as a coping capability boundary of the unmanned vehicle to be tested.

In an embodiment, in yet another possible implementation of the second aspect, the value obtaining module is specifically configured to:

obtain pre-stored traveling information of the unmanned vehicle to be tested, where the pre-stored traveling information includes pre-stored driving information and pre-stored environment information corresponding to the pre-stored driving information; determine pre-stored driving behavior information of the unmanned vehicle to be tested and pre-stored scenario information corresponding to the pre-stored driving behavior information, according to the pre-stored traveling information; cluster the pre-stored scenario information to obtain at least one scenario feature and the pre-stored driving behavior information corresponding to each of the scenario feature, where the scenario feature is used to indicate a classification feature of the pre-stored scenario information of a same class; determine a target driving behavior type according to the indicator item; and determine historical driving behavior information of the unmanned vehicle to be tested from the pre-stored driving behavior information according to the scenario feature corresponding to the preset driving scenario and the target driving behavior type.

In an embodiment, in yet another possible implementation of the second aspect, before obtaining historical driving behavior information of the unmanned vehicle to be tested according to a scenario feature corresponding to the preset driving scenario and the indicator item, the value obtaining module is further configured to:

determine a plurality of indicator items and the scenario feature corresponding to the preset driving scenario according to a capability type corresponding to the coping capability boundary information to be determined; and determine a set of indicator combination from the plurality of indicator items, where the indicator combination includes at least one of the indicator items.

In an embodiment, in yet another possible implementation of the second aspect, the pre-stored environment information includes timestamp information.

After obtaining coping capability boundary information corresponding to the indicator combination of the unmanned vehicle to be tested in the preset driving scenario according to the historical driving behavior information, the processing module is further configured to:

obtain timestamp information corresponding to the coping capability boundary information according to the pre-stored environment information corresponding to the historical driving behavior information; determine, according to the timestamp information corresponding to the coping capability boundary information, period coping capability boundary information of the unmanned vehicle to be tested in a plurality of preset time periods, where the time period indicates a surrounding vegetation growth stage of the preset driving scenario; compare the period coping capability boundary information of the unmanned vehicle to be tested in the plurality of preset time periods, and obtain a coping capability boundary comparison result.

According to a third aspect of the present disclosure, the present disclosure provides an electronic device, including: a memory, a processor, and a computer program, the computer program is stored in the memory, the processor runs the computer program to implement the method for determining coping capability boundary information of an unmanned vehicle according to the first aspect of the disclosure and various possible designs of according to the first aspect.

According to a fourth aspect of the present disclosure, the present disclosure provides a readable storage medium, a computer program stored in the readable storage medium, and the computer program when being executed by a processor, is used to implement the method for determining coping capability boundary information of an unmanned vehicle according to the first aspect of the present disclosure and various possible designs of the first aspect.

The disclosure provides a method and an apparatus for determining coping capability boundary information of unmanned vehicles, and an electronic device. A set of indicator combination for evaluating an coping capability of an unmanned vehicle to be tested in a preset driving scenario is obtained, where the indicator combination includes at least one indicator item and an expected value range of the indicator item; historical driving behavior information of the unmanned vehicle to be tested is obtained according to a scenario feature corresponding to the preset driving scenario and the indicator item; and coping capability boundary information corresponding to the indicator combination of the unmanned vehicle to be tested in the preset driving scenario is obtained according to the historical driving behavior information, which realizes the coping capability boundary of the unmanned vehicle corresponding to the indicator combination that needs to be tested, and can flexibly find the performance defects of the unmanned vehicle, thereby improving the accuracy and pertinence of the unmanned vehicle test.

DETAILED DESCRIPTION OF THE EMBODIMENTS

Figure 1:
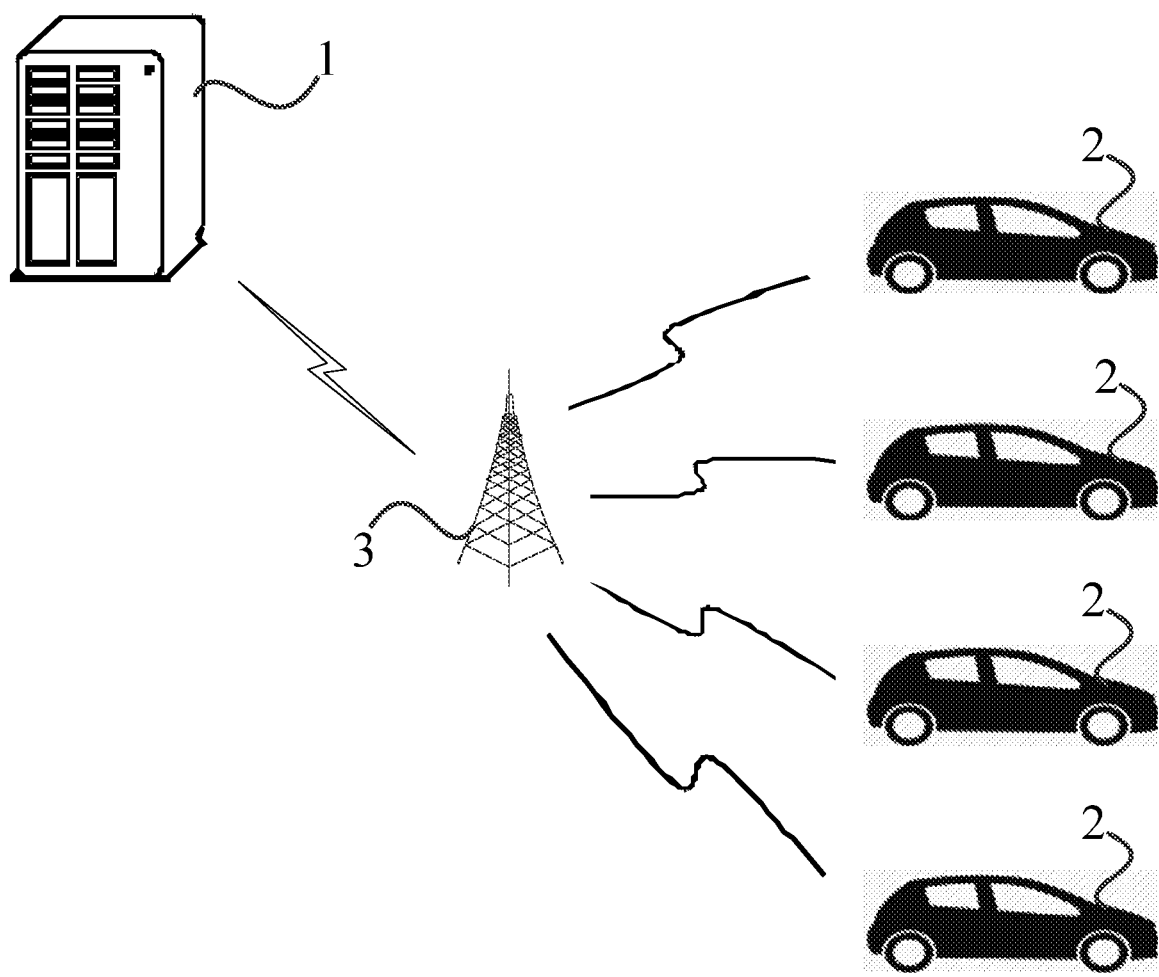
FIG. 1 is a schematic diagram of an application scenario according to an embodiment of the present disclosure.

In order to make the objectives, technical solutions and advantages of the embodiments of the present disclosure more clear, the technical solutions in the embodiments of the present disclosure are clearly and completely described in the following with reference to the accompanying drawings in the embodiments of the present disclosure. Obviously, the described embodiments are merely part of the embodiments of the present disclosure, rather than all of the embodiments. All other embodiments obtained by those skilled in the art based on the embodiments of the present disclosure without creative efforts are within the scope of the present disclosure.

The terms "first", "second", etc. (if present) in the specification and claims of the present disclosure and the above drawings are used to distinguish similar objects, and are not necessarily used to describe a particular order or sequence. It will be appreciated that the data so used may be interchanged where appropriate so that the embodiments of the disclosure described herein can be implemented in an order other than those illustrated or described herein.

It should be understood that in various embodiments of the present disclosure, the size of the sequence number of each process does not imply a sequence of execution orders, the order of execution of the processes should be determined by their functions and intrinsic logic, and should not be construed as limiting the implementation of the embodiments of the present disclosure.

It should be understood that in the present disclosure, "comprising" and "including" and any variants thereof are intended to cover non-exclusive inclusions, for example, a process, method, system, product, or devices that comprises a series of steps or units is not necessarily limited to those steps or units that are clearly listed, but may include other steps or units not explicitly listed or inherent to such processes, methods, products, or devices.

It should be understood that in the present disclosure, "a plurality of" means two or more. "And/or" is just an association that describes the associated objects, indicating that there can be three kinds of relationship, for example, A and/or B, can indicate that there are three cases where A exists separately, A and B exist simultaneously, and B exists separately. A character "/" generally indicates that the contextual objects are in an "or" relationship. The expression "including A, B, and C" and "including A, B, C" means that A, B and C are all included, and "including A, B, or C" means including one of A, B or C, while "including A, B and/or C" means including any one or two or three of A, B and C.

It should be understood that in the present disclosure, "B corresponding to A", "B that corresponds to A", "A corresponds to B" or "B corresponds to A" means that B is associated with A, and B can be determined according to A. Determining B according to A does not mean that B is determined only according to A, and B can also be determined based on A and/or other information. The match between A and B is that the similarity between A and B is greater than or equal to the preset threshold.

Depending on the context, "if" as used herein may be interpreted as "when" or "while" or "in response to determining" or "in response to detecting".

The technical solutions of the present disclosure are described in detail in the following specific embodiments. The following specific embodiments may be combined with each other, and the same or similar concepts or processes may not be described in some embodiments.

It should be understood that in the present disclosure, "longitudinal" refers to a front and rear direction of an unmanned vehicle, which can be understood as a direction from the rear of the vehicle to the front of the vehicle, for example, a longitudinal distance is a straight displacement of the unmanned vehicle going straight forward or backward. In contrast, "horizontal" refers to a left and right direction of the unmanned vehicle, which can be understood as a direction from both sides of the vehicle. For example, a horizontal distance is a lateral displacement generated during a driving of the unmanned vehicle.

Refer to FIG. 1, which is a schematic diagram of an application scenario according to an embodiment of the present disclosure. In an application scenario as shown in FIG. 1, unmanned vehicles 2 can be understood as a same type of vehicles with a driverless function, and a plurality of unmanned vehicles 2 upload respective collected data to a server 1 through a base station 3. An unmanned vehicle 2 shown in FIG. 1 may be understood as a vehicle-mounted driverless system, or a client connected to a vehicle control system. An unmanned vehicle 2 may be a test vehicle or a vehicle in actual use. For example, an unmanned vehicle 2 in actual use displays to a user whether or not to participate in a long-term optimization plan, and if the user chooses to participate, the unmanned vehicle uploads non-user privacy data collected by itself to the server 1. The unmanned vehicle 2 collects various data, such as data of a relative distance between itself and a leading vehicle, its own speed, and a ruggedness of road, during an autonomous driving process. The unmanned vehicle 2 uploads collected data to the server 1 periodically or in real time. The server 1 can be understood as a server provided by an unmanned vehicle manufacturer, or a server provided by an intelligent system supplier for gathering the data collected by each unmanned vehicle 2, and performing steps in following various embodiments. The server 1 determines coping capability boundary information of the unmanned vehicle 2 according to various needs, and finds potential performance defects of the unmanned vehicle 2, so as to perform corresponding improvement development or optimization of configuration information.

Figure 2:
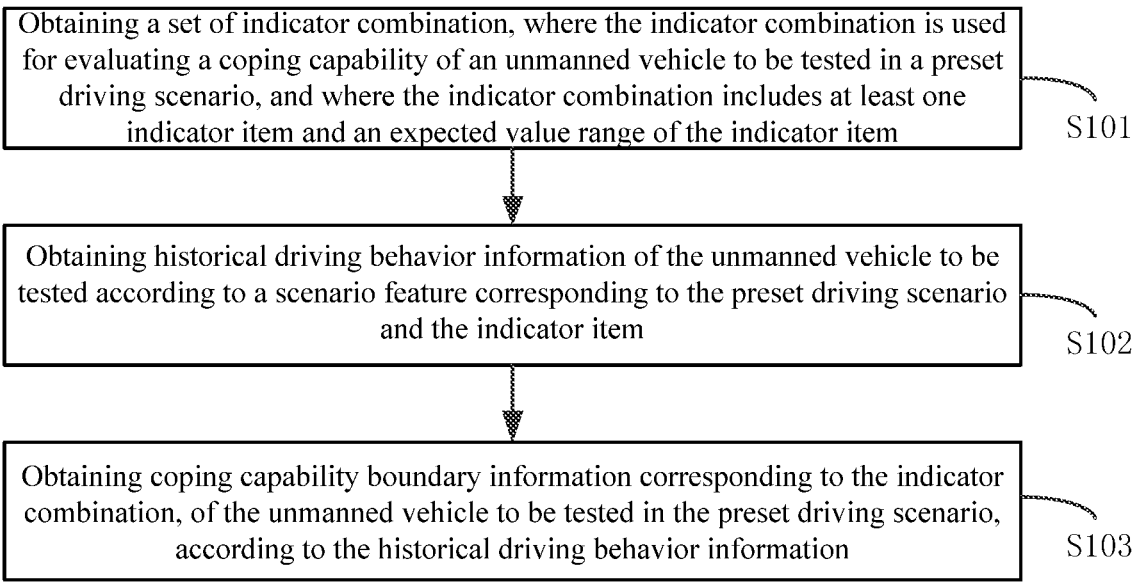
FIG. 2 is a schematic flowchart of a method for determining coping capability boundary information of an unmanned vehicle according to an embodiment of the present disclosure.

Refer to FIG. 2, which is a schematic flowchart of a method for determining coping capability boundary information of an unmanned vehicle according to an embodiment of the present disclosure. An executive subject of the method shown in FIG. 2 may be a software and/or a hardware apparatus. A server is taken as an example of the executive subject in the following, so as to explain various possible implementation manners in embodiments of the present disclosure. The method shown in FIG. 2 mainly includes steps S101 to S103, as follows.

S101, obtaining a set of indicator combination, where the indicator combination is used for evaluating a coping capability of an unmanned vehicle to be tested in a preset driving scenario, and where the indicator combination includes at least one indicator item and an expected value range of the indicator item.

It can be understood that a set of indicator combination is selected according to a requirement of a test project or a performance that a user proposes to improve. For example, according to statistical analysis of a vehicle maintenance record, maintenance personnel found that it was difficult for the unmanned vehicle 2 shown in FIG. 1 to reduce an accident probability of rear-end collision caused by leading vehicle's deceleration, so it is necessary to evaluate the coping capability boundary of the unmanned vehicle 2 in a driving scenario of a leading vehicle decelerating. There may be various kinds of indicator combinations corresponding to the coping capability in the driving scenario of a leading vehicle decelerating, where there may include a combination of following three indicators:

time to collision (TTC) is greater than 2 s, distance between the two vehicles after stopping is greater than 2 m, longitudinal acceleration is greater than or equal to $-4$ m/s$^2$ and less than or equal to 4 m/s$^2$.

The indicator items are the TTC, the distance between the two vehicles after stopping, and the longitudinal acceleration, and an expected value range for each of the indicator items is greater than 2 s, greater than 2 m, and greater than or equal to $-4$ m/s$^2$ and less than or equal to 4 m/s$^2$, respectively.

In an embodiment, the preset driving scenario may be, for example, a scenario of a leading vehicle decelerating, a scenario of a pedestrian crossing a road, a scenario of a vehicle merging in front and then decelerating, a scenario of lane changing and traffic merging, a scenario of following a vehicle, a scenario of turning left at an intersection, a scenario of turning right at an intersection, a scenario of making a U-turn at an intersection, and the like. Each driving scenario corresponds to a plurality of indicator items, and the indicator combination is selected among indicator items corresponding to the driving scenario according to a purpose of evaluation, i.e., the coping capability boundary information that needs to be determined.

Since the purpose of the evaluation is different, the selected indicator combination will be different. The selection of the above indicator combination can be determined according to different types of coping capability. The types of coping capability may be divided into: safety coping capability, comfort coping capability and traffic efficiency coping capability. Optional indicator item corresponding to the safety coping capability may be, for example, TTC, time headway (THW), and Post Encroachment Time (PET) etc. Optional indicator items corresponding to comfort coping capability may be, for example, longitudinal acceleration, lateral acceleration, lateral movement distance, and longitudinal movement distance. Optional indicator items corresponding to the traffic efficiency coping capability may be, for example, unreasonable stop and unreasonable giving way.

S102, obtaining historical driving behavior information of the unmanned vehicle to be tested according to a scenario feature corresponding to the preset driving scenario and the indicator item.

Specifically, the server may first obtain traveling information of the unmanned vehicle that is pre-stored by the server, where the pre-stored traveling information includes pre-stored driving information and pre-stored environment information corresponding thereto. The unmanned vehicle to be tested can be understood as a same type of vehicles as the unmanned vehicles 2 in the application scenario shown in FIG. 1, that is, software and hardware environment of the vehicles is consistent. The pre-stored traveling information can be understood as data collected by the unmanned vehicle 2 and uploaded to the server 1 in the application scenario shown in FIG. 1. The pre-stored driving information is, for example, information on driving data such as throttle opening amount, clutch state, rotation angle of the steering wheel, and on/off control of vehicle lights, which are collected by the unmanned vehicle to be tested in automatic operations. The pre-stored environment information is, for example, environmental data such as ruggedness coefficient of road, weather data, driving information of leading vehicle(s), and traffic lights indication information, during an autonomous driving process of the unmanned vehicle to be tested.

The pre-stored traveling information reflects driving operations of the vehicle itself and surrounding environment. The server further determines pre-stored driving behavior information of the unmanned vehicle to be tested and pre-stored scenario information corresponding to the pre-stored driving behavior information, according to the pre-stored traveling information. For example, vehicle speed information of the unmanned vehicle can be determined based on the throttle opening amount and the clutch state in combination with the ruggedness coefficient of the road and the weather data, and then, further in combination with the rotation angle of the steering wheel, a turning speed and a turning acceleration can be determined, that is, the pre-stored driving behavior information is obtained. For another example, deceleration information of a leading vehicle is obtained according to the leading vehicle's traveling information, thereby determining that the pre-stored scenario information is information indicating a scenario of a leading vehicle decelerating. The pre-stored driving behavior information and the pre-stored scenario information may be pre-bound and stored with the pre-stored traveling information.

The server clusters the pre-stored scenario information to obtain at least one scenario feature and the pre-stored driving behavior information corresponding to each scenario feature, where the scenario feature is used to indicate a classification feature of the pre-stored scenario information of a same class. For example, four types of pre-stored scenario information with an acceleration of leading vehicle deceleration of $-4$ m/s$^2$, $-4.5$ m/s$^2$, $-5$ m/s$^2$, and $-6$ m/s$^2$ are classified into one category, which are used as the scenario of a leading vehicle decelerating, the scenario feature may be number 079 or "leading vehicle deceleration", and this embodiment is not limited thereto. Therefore, in the data pre-stored by the server, the pre-stored driving behavior information has a corresponding relationship with the scenario feature.

The server then determines a target driving behavior type according to the indicator item, and determines the historical driving behavior information of the unmanned vehicle to be tested, from the pre-stored driving behavior information, according to the scenario feature corresponding to the preset driving scenario and the target driving behavior type. It can be understood that, since different indicator items may correspond to different types of driving behaviors, for example, an indicator of people-to-vehicle distance after stopping is irrelevant to a driving behavior "relative speed to a leading vehicle". Therefore, the selection range is narrowed down by the indicator items, and the target driving behavior type is obtained, and then the scenario feature is used for further screening so as to obtain the historical driving behavior information of the unmanned vehicle to be tested required by the server.

In an embodiment, before the step S102 (obtaining historical driving behavior information of the unmanned vehicle to be tested according to a scenario feature corresponding to the preset driving scenario and the indicator item), the method may further include a process of determining the indicator combination: first, determining a plurality of indicator items and the scenario feature corresponding to the preset driving scenario according to a capability type corresponding to the coping capability boundary information to be determined; then determining a set of indicator combination from the plurality of indicator items, where the indicator combination includes at least one of the indicator items. For example, each capability type is bound to a plurality of indicator items and scenario features, and the plurality of indicator items and scenario features bound with the capability type corresponding to the coping capability boundary information to be determined are obtained. In the plurality of indicator items, a specific manner of determining a set of indicator combination may be: selecting based on accuracy of the pre-stored data, degree of correlation between the indicator items and the capability type, and the like.

S103, obtaining coping capability boundary information corresponding to the indicator combination, of the unmanned vehicle to be tested in the preset driving scenario, according to the historical driving behavior information.

Figure 3:
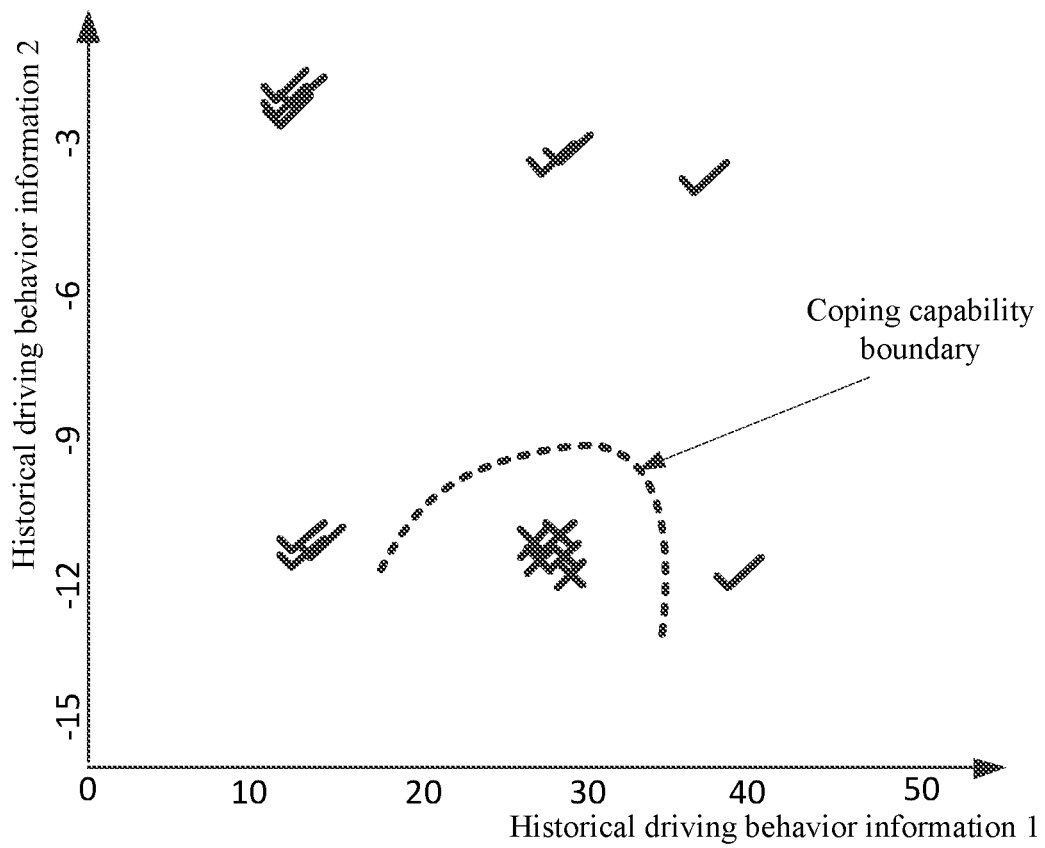
FIG. 3 is an example of a coping capability boundary corresponding to an indicator combination of a safe coping capability according to an embodiment of the present disclosure.

It can be understood as that, according to the historical driving behavior information, each indicator item in the indicator combination is calculated, and if all the indicator item in the indicator combination can reach the corresponding expected value range, it is considered that the unmanned vehicle to be tested can cope with the indicator combination when applying the historical driving behavior information. For example, for an indicator combination A of the safety coping capability, which includes indicator items A1, A2, and A3, it is determined to be able to cope when A1, A2, and A3 are satisfied at the same time. In this way, the autonomous driving simulation is executed with a plurality of sets of historical driving behavior information, to obtain a plurality of results of being able or unable to cope, and the coping capability boundary information of the indicator combination A for the unmanned vehicle to be tested is determined among the plurality of results of being able or unable to cope. Refer to FIG. 3, which is an example of a coping capability boundary corresponding to an indicator combination of a safety coping capability according to an embodiment of the present disclosure. In FIG. 3, the horizontal and vertical coordinates are historical driving behavior information, and the ticked coordinate points indicate that a successful coping result is obtained for the unmanned vehicle to be tested when the historical driving behavior information corresponding to the points is used, while the crossed coordinate points indicate that a failed coping result is obtained for the unmanned vehicle to be tested when the historical driving behavior information corresponding to the points is used. As can be seen from FIG. 3, when more sets of history driving behavior information are used for the autonomous driving simulation, more results of being able or unable to cope can be obtained, and more accurate coping capability boundary and coping capability boundary information can be obtained from these results. FIG. 3 only takes two-dimensional historical driving behavior information as an example, which may also be three-dimensional or more dimensional historical driving behavior information, since a principle for obtaining the dividing boundary is similar, which will not be illustrated in the following.

Figure 4:
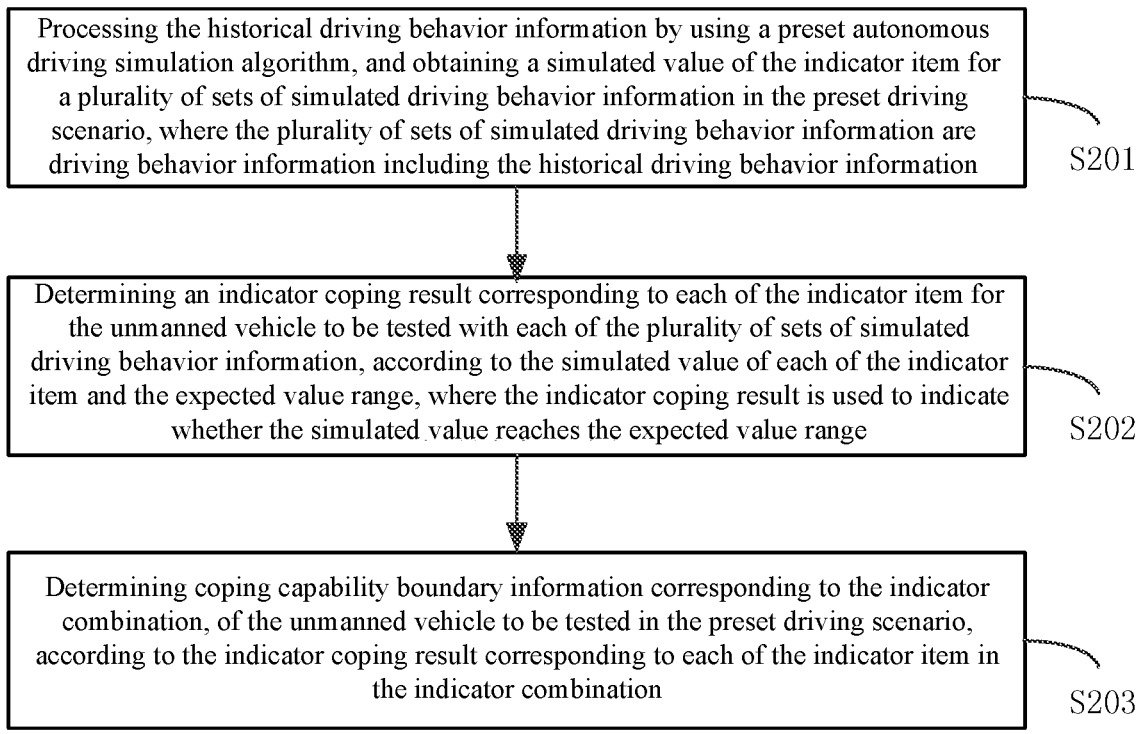
FIG. 4 is a schematic flow chart of an optional method of step S103 in FIG. 2 according to an embodiment of the present disclosure.

Refer to FIG. 4, which is a schematic flow chart of an optional method of step S103 in FIG. 2 according to an embodiment of the present disclosure. In order to explain the above step S103 more clearly, it will be described below in conjunction with FIG. 4 and a specific embodiment. The method as shown in FIG. 4 mainly includes steps S201 to S203 as follows.

S201, processing the historical driving behavior information by using a preset autonomous driving simulation algorithm, and obtaining a simulated value of the indicator item for a plurality of sets of simulated driving behavior information in the preset driving scenario, where the plurality of sets of simulated driving behavior information are driving behavior information including the historical driving behavior information.

It may be understood as that, firstly, interpolation processing is performed on a small amount of historical driving behavior information to obtain the plurality of sets of simulated driving behavior information which are more than the historical driving behavior information. Then, an autonomous driving simulation is performed with the simulated driving behavior information to obtain the simulated value of the indicator item. The preset autonomous driving simulation algorithm can be considered as a method executed by any of the existing various types of autonomous driving models, and in addition to the simulated driving behavior information as an input, other vehicle parameters that may be used may be set to preset values, which is not limited in this embodiment. For example, the simulated driving behavior information is: main vehicle speed 40 m/s, longitudinal acceleration 30 m/s$^2$, relative distance 85 m, leading vehicle longitudinal acceleration −4 m/s$^2$; the simulated value of the TTC indicator item obtained by simulation is 3 s.

S202, determining an indicator coping result corresponding to each of the indicator item for the unmanned vehicle to be tested with each of the plurality of sets of simulated driving behavior information, according to the simulated value of each of the indicator item and the expected value range, where the indicator coping result is used to indicate whether the simulated value reaches the expected value range.

For example, only the TTC indicator item is included in the indicator combination, and the expected value range is greater than 2 s. In the previous step, the simulated value of the TTC indicator item obtained by simulating is 3 s, and therefore, it can be determined that the indicator coping result corresponding to the TTC indicator item for the unmanned vehicle to be tested with the simulated driving behavior information (40 m/s, 30 m/s$^2$, 85 m, −4 m/s$^2$) is: successful coping. It can be understood as that, in the multi-dimensional coordinate system established by simulated driving behavior information, the point (40 m/s, 30 m/s$^2$, 85 m, −4 m/s$^2$) corresponds to successful coping, and the coordinate points ticked in FIG. 3 can be referred to for an example of its representation in the coordinate system. In contrast, if the simulated value of the TTC indicator item obtained from another set of simulated driving behavior information is less than or equal to 2 s, the point corresponds to a failure, the crossed coordinate points in FIG. 3 can be referred to for an example of its representation in the coordinate system.

S203, determining coping capability boundary information corresponding to the indicator combination, of the unmanned vehicle to be tested in the preset driving scenario, according to the indicator coping result corresponding to each of the indicator item in the indicator combination.

After obtaining the ticked and crossed diagram of the coordinate system in the previous step, it is possible to determine a coping capability boundary according to the distribution of the ticked coordinate points and the crossed coordinate points. The coping capability boundary information is obtained based on the coping capability boundary obtained in the coordinate system. The coping capability boundary information is, for example, coordinate values of the coping capability boundary and obtained simulated value of the indicator item.

An implementation of S203 (determining coping capability boundary information corresponding to the indicator combination of the unmanned vehicle to be tested in the preset driving scenario according to the indicator coping result corresponding to each of the indicator item in the indicator combination), may be specifically as follows.

First, a combined coping result corresponding to the indicator combination is determined for the simulated driving behavior information according to the indicator coping result corresponding to each of the indicator item in the indicator combination. For example, when the simulated driving behavior information successfully copes with each indicator item in the indicator combination, it is determined that the simulated driving behavior information successfully copes with the indicator combination, and as long as one indicator item fails to be coped with, it is determined that the simulated driving behavior information fails to cope with the indicator combination. The coping result corresponding to any indicator item or the combined result corresponding to the indicator combination can be represented by the ticked and crossed diagram of the coordinate system as shown in FIG. 3.

Then, the coping capability boundary for the simulated driving behavior information is determined, according to the combined coping result corresponding to the indicator combination for the simulated driving behavior information. The coping capability boundary is used to divide the simulated driving behavior information into a first type of simulated driving behavior information corresponding to a combined coping result indicating successful coping, and a second type of simulated driving behavior information corresponding to a combined coping result indicating failed coping. For example, the ticked coordinate points shown in FIG. 3 correspond to the first type of simulated driving behavior information, and the crossed coordinate points correspond to the second type of simulated driving behavior information. Specifically, a first capability boundary may be determined for the simulated driving behavior information, according to a combined coping result corresponding to the indicator combination for the simulated driving behavior information. The first capability boundary may be considered as a boundary of theoretical values, and can be directly used as the coping capability boundary, or it may be corrected with real values to obtained the coping capability boundary. The process of correcting with real values mainly includes: obtaining boundary historical driving behavior information within a preset range of the first capability boundary, from the historical driving behavior information. It can be understood as obtaining values near the first capability boundary. Then a real coping result corresponding to the boundary historical driving behavior information is obtained, where the real coping result indicates a real coping situation correspond to the indicator combination when the unmanned vehicle applies the boundary historical driving behavior information in the driving scenario. The real coping result can be understood as data actually measured on road. The first capability boundary is corrected with the real coping result to obtain a second capability boundary. The second capability boundary is used as the coping capability boundary of the unmanned vehicle to be tested. In this embodiment, the accuracy of the coping capability boundary can be improved by correcting the capability boundary with the real coping result.

Finally, the simulated driving behavior information corresponding to the coping capability boundary is taken as the coping capability boundary information corresponding to the indicator combination, of the unmanned vehicle to be tested in the preset driving scenario. It can be understood as obtaining the coordinate point information and the coping result of each indicator item that correspond to the coping capability boundary.

The embodiment provides a method and apparatus for determining coping capability boundary information of an unmanned vehicle, and an electronic device. A set of indicator combination is obtained for evaluating a coping capability of an unmanned vehicle to be tested in a preset driving scenario, where the indicator combination includes at least one indicator item and an expected value range of the indicator item; historical driving behavior information of the unmanned vehicle to be tested is obtained according to a scenario feature corresponding to the preset driving scenario and the indicator item; coping capability boundary information corresponding to the indicator combination, of the unmanned vehicle to be tested in the preset driving scenario is obtained according to the historical driving behavior information, which realizes the coping capability boundary of the unmanned vehicle corresponding to the indicator combination that need to be tested, and can flexibly find the performance defects of the unmanned vehicle, thereby improving the accuracy and pertinence of the unmanned vehicle test.

On the basis of the foregoing embodiment, the pre-stored environment information may include timestamp information.

Figure 5:
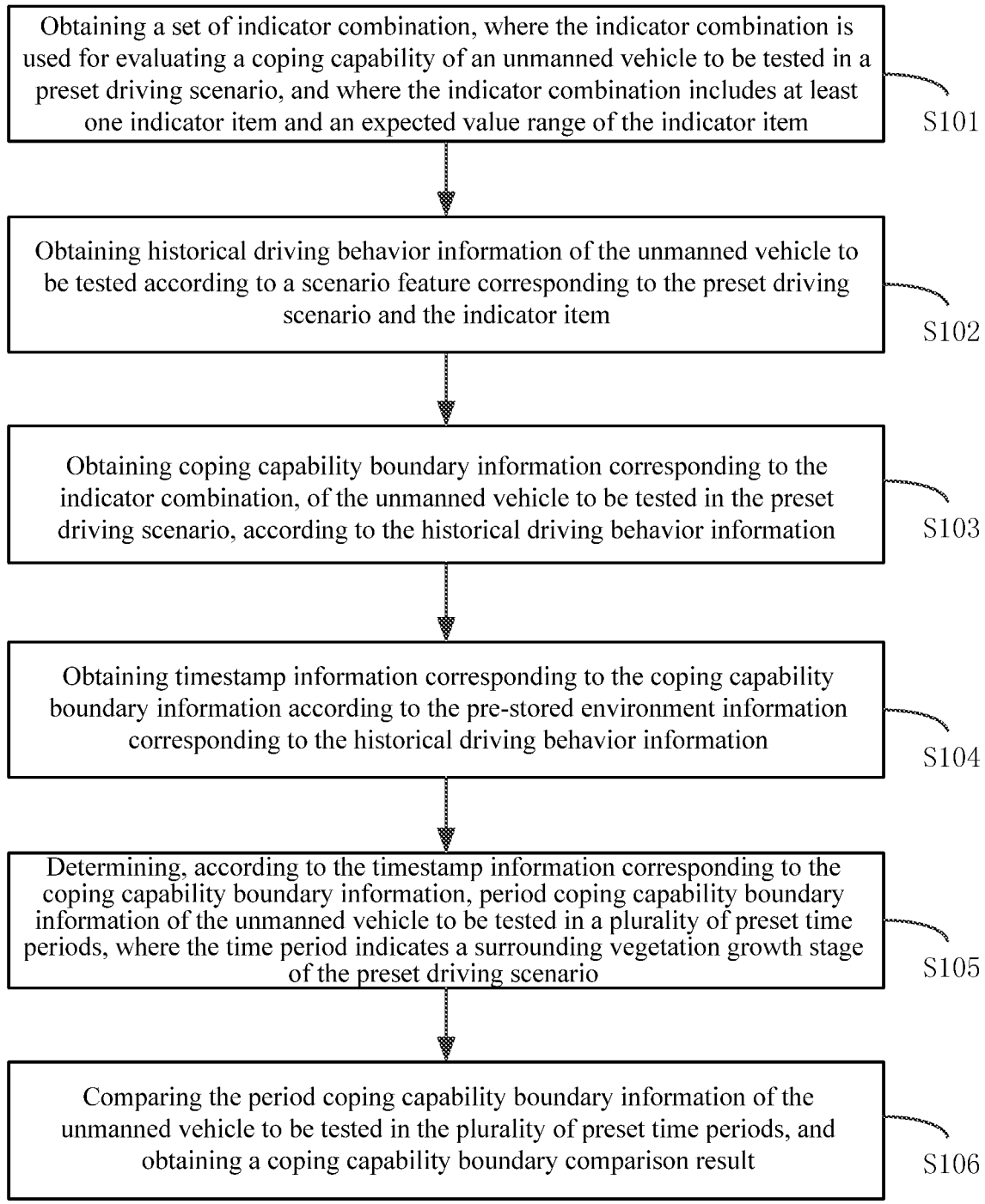
FIG. 5 is a schematic flowchart of another method for determining coping capability boundary information of an unmanned vehicle according to an embodiment of the present disclosure.

Refer to FIG. 5, FIG. 5 is a schematic flowchart of another method for determining coping capability boundary information of an unmanned vehicle according to an embodiment of the present disclosure. In order to evaluate the influence of surrounding vegetation growth on the coping capability boundary of the unmanned vehicle, after S103 (obtaining coping capability boundary information corresponding to the indicator combination for the unmanned vehicle to be tested in the preset driving scenario according to the historical driving behavior information), following steps S104 to S106 may also be included.

S104, obtaining timestamp information corresponding to the coping capability boundary information according to the pre-stored environment information corresponding to the historical driving behavior information.

The timestamp information can be understood as an uploading time point of the historical driving behavior information. For example, the unmanned vehicle to be tested obtains its own data and uploads it to the server in real time, and timestamp information is attached to each piece of data at the same time of uploading.

S105, determining, according to the timestamp information corresponding to the coping capability boundary information, period coping capability boundary information of the unmanned vehicle to be tested in a plurality of preset time periods, where the time period indicates a surrounding vegetation growth stage of the preset driving scenario.

It can be understood as that, the surrounding vegetation growth stage in the preset driving scenario in one year is assumed to be divided into two stages: a leaf stage and a deciduous stage. Since falling leaves in the deciduous stage may have an unknowable effect on the environmental information detected by the unmanned vehicle to be tested. The period coping capability boundary information may be obtained for each of the two stages.

S106, comparing the period coping capability boundary information of the unmanned vehicle to be tested in the plurality of preset time periods, and obtaining a coping capability boundary comparison result.

For example, the period coping capability boundary information corresponding to the leaf stage and that of the deciduous stage are extracted and compared, and the obtained capability boundary comparison result reflects the influence of the vegetation growth on the coping capability of the unmanned vehicle to be tested.

Figure 6:
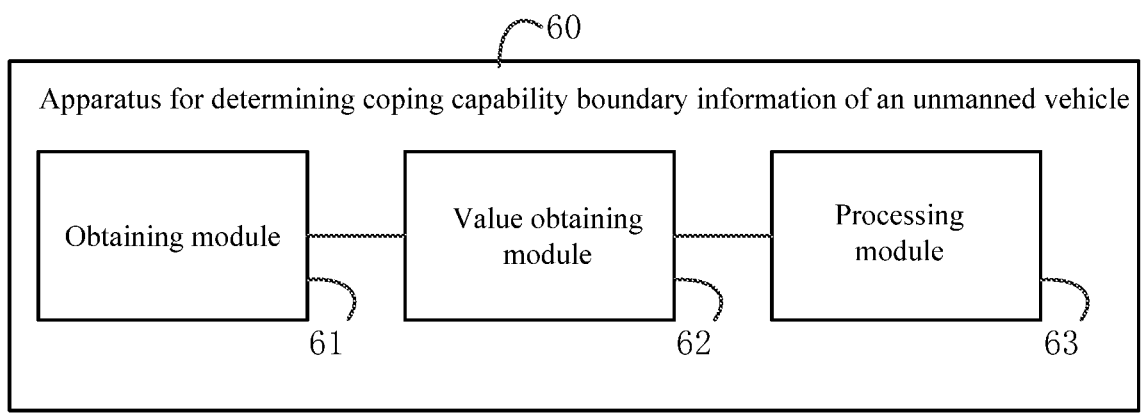
FIG. 6 is a schematic structural diagram of an apparatus for determining coping capability boundary information of an unmanned vehicle according to an embodiment of the present disclosure.

Refer to FIG. 6, which is a schematic structural diagram of an apparatus for determining coping capability boundary information of an unmanned vehicle according to an embodiment of the present disclosure. An apparatus 60 for determining coping capability boundary information of an unmanned vehicle shown in FIG. 6 mainly includes:

an obtaining module 61, configured to obtain a set of indicator combination, where the indicator combination is used for evaluating a coping capability of an unmanned vehicle to be tested in a preset driving scenario, and where the indicator combination includes at least one indicator item and an expected value range of the indicator item;

a value obtaining module 62, configured to obtain, according to a scenario feature corresponding to the preset driving scenario and the indicator item, historical driving behavior information of the unmanned vehicle to be tested;

a processing module 63, configured to obtain, according to the historical driving behavior information, coping capability boundary information corresponding to the indicator combination, of the unmanned vehicle to be tested in the preset driving scenario.

The apparatus for determining coping capability boundary information of an unmanned vehicle in an embodiment shown in FIG. 6 is correspondingly applicable to performing the steps in the method embodiment shown in FIG. 2, and the implementation principle and technical effect are similar and will not be described here.

In an embodiment, a processing module 63 is specifically configured to:

process the historical driving behavior information by using a preset autonomous driving simulation algorithm, and obtain a simulated values corresponding to the indicator item for a plurality of sets of simulated driving behavior information in the preset driving scenario, where the plurality of sets of simulated driving behavior information are driving behavior information including the historical driving behavior information; determine, according to the simulated value corresponding to each indicator item and the expected value range, an indicator coping result corresponding to each indicator item, for the unmanned vehicle to be tested with each set of the simulated driving behavior information, where the indicator coping result is used to indicate whether the simulated value reaches the expected value range; determine the coping capability boundary information corresponding to the indicator combination for the unmanned vehicle to be tested in the preset driving scenario according to the indicator coping result corresponding to each indicator item in the indicator combination.

In an embodiment, the processing module 63 is specifically configured to:

determine a combined coping result corresponding to the indicator combination, for the simulated driving behavior information, according to the indicator coping result corresponding to each indicator item in the indicator combination; determine a coping capability boundary for the simulated driving behavior information according to the combined coping result corresponding to the indicator combination for the simulated driving behavior information, where the coping capability boundary is used to divide the simulated driving behavior information into a first type of simulated driving behavior information corresponding to a combined coping result indicating successful coping, and a second type of simulated driving behavior information corresponding to a combined coping result indicating failed coping; and take the simulated driving behavior information corresponding to the coping capability boundary as the coping capability boundary information corresponding to the indicator combination of the unmanned vehicle to be tested in the preset driving scenario.

In an embodiment, the processing module 63 is specifically configured to:

determine a first capability boundary for the simulated driving behavior information, according to the combined coping result corresponding to the indicator combination for the simulated driving behavior information; obtain boundary historical driving behavior information within a preset range of the first capability boundary, from the historical driving behavior information; obtain a real coping result corresponding to the boundary historical driving behavior information, where the real coping result indicates a real coping situation corresponding to the indicator combination when the unmanned vehicle applies the boundary historical driving behavior information in the driving scenario; correct the first capability boundary with the real coping result to obtain a second capability boundary; and take the second capability boundary as the coping capability boundary of the unmanned vehicle to be tested.

In an embodiment, the value obtaining module 62 is specifically configured to:

obtain pre-stored traveling information of the unmanned vehicle to be tested, which is pre-stored, where the pre-stored traveling information includes pre-stored driving information and pre-stored environment information corresponding to the pre-stored driving information; determine pre-stored driving behavior information of the unmanned vehicle to be tested and pre-stored scenario information corresponding to the pre-stored driving behavior information, according to the pre-stored traveling information; cluster the pre-stored scenario information to obtain at least one scenario feature and the pre-stored driving behavior information corresponding to each scenario feature, where the scenario feature is used to indicate a classification feature of the pre-stored scenario information of a same class; determine a target driving behavior type according to the indicator item; determine the historical driving behavior information of the unmanned vehicle to be tested from the pre-stored driving behavior information according to the scenario feature corresponding to the preset driving scenario and the target driving behavior type.

In an embodiment, before obtaining the historical driving behavior information of the unmanned vehicle to be tested according to the scenario feature corresponding to the preset driving scenario and the indicator item, the value obtaining module 62 is further configured to:

determine a plurality of indicator items and the scenario feature corresponding to the preset driving scenario according to a capability type corresponding to the coping capability boundary information to be determined; and determine a set of indicator combination from the plurality of indicator items, where the indicator combination includes at least one of the indicator items.

In an embodiment, the pre-stored environment information includes timestamp information.

After obtaining the coping capability boundary information corresponding to the indicator combination, of the unmanned vehicle to be tested in the preset driving scenario, according to the historical driving behavior information, the processing module 63 is further configured to:

obtain timestamp information corresponding to the coping capability boundary information according to the pre-stored environment information corresponding to the historical driving behavior information; determine, according to the timestamp information corresponding to the coping capability boundary information, period coping capability boundary information of the unmanned vehicle to be tested in a plurality of preset time periods, where the time period indicates a surrounding vegetation growth stage of the preset driving scenario; and compare the period coping capability boundary information of the unmanned vehicle to be tested in the plurality of preset time periods, and obtain a coping capability boundary comparison result.

Figure 7:
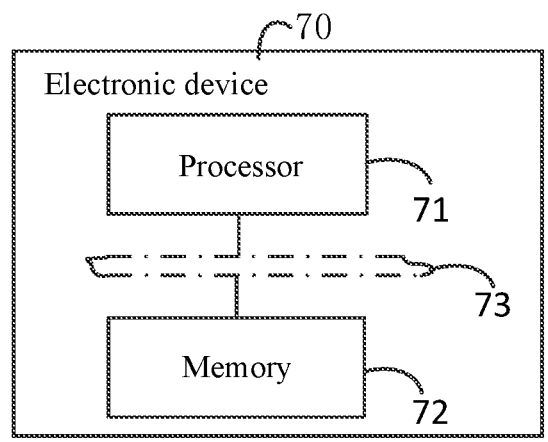
FIG. 7 is a schematic structural diagram of hardware of an electronic device according to an embodiment of the present disclosure.

Refer to FIG. 7, which is a schematic structural diagram of hardware of an electronic device according to an embodiment of the present disclosure. The electronic device 70 includes a processor 71, a memory 72, and a computer program.

The memory 72 is configured to store the computer program, where the memory may also be a flash memory. The computer program is, for example, an application program, a function module, etc. that implements the above method.

The processor 71 is configured to execute the computer program stored in the memory, to implement various steps performed by the electronic device in the foregoing method. For details, refer to related descriptions in the foregoing method embodiments.

In an embodiment, the memory 72 can be either independent from or integrated with the processor 71.

When the memory 72 is an apparatus independent from the processor 71, the electronic device may further include:

a bus 73, configured to connect the memory 72 and the processor 71. The disclosure also provides a readable storage medium, the computer program is stored in the readable storage medium, and the computer program is executed by a processor to implement the method provided by the various embodiments described above.

The readable storage medium may be a computer storage medium or a communication medium. The communication medium includes any medium that facilitates the transfer of a computer program from one location to another. The computer storage medium can be any available medium that can be accessed by a general purpose or special purpose computer. For example, the readable storage medium is coupled to the processor, such that the processor can read information from the readable storage medium and can write information to the readable storage medium. Of course, the readable storage medium can also be part of the processor. The processor and the readable storage medium may be located in an Application Specific Integrated Circuits (ASIC). In addition, the ASIC can be located in the user device. Of course, the processor and the readable storage medium may also exist as separate components in a communication device. The readable storage medium may be a read only memory (ROM), a random-access memory (RAM), a CD-ROM, a magnetic tape, a floppy disk, and an optical data storage device etc.

The present disclosure also provides a program product including execution instructions, and the execution instructions are stored in a readable storage medium. At least one processor of a device can read the execution instructions from the readable storage medium, and the at least one processor executes the execution instructions such that the device implements the methods provided by the various embodiments described above.

In the above embodiment of the electronic device, it should be understood that the processor may be a central processing unit (CPU), and may also be other general-purpose processor, digital signal processor (DSP), or application specific integrated circuit (ASIC) etc. The general-purpose processor may be a microprocessor or the processor may be any conventional processor, etc. The steps of the method disclosed in the present disclosure may be directly embodied by execution of a hardware processor, or by execution of a combination of hardware and software modules in the processor.

Finally, it should be noted that the above embodiments are only used to illustrate the technical solutions of the present disclosure, and the present disclosure is not limited thereto; although the present disclosure has been described in detail with reference to the foregoing embodiments, it should be understood by those skilled in the art that the technical solutions described in the foregoing embodiments may be modified, or some or all of the technical features may be equivalently replaced; however, the modifications or substitutions do not deviate from the scope of the technical solutions of the embodiments of the present disclosure.

What is claimed is:

1. A method for determining coping capability boundary information of an unmanned vehicle, comprising:
obtaining, by a server, a set of indicator combination, wherein the indicator combination is used for evaluating a coping capability of an unmanned vehicle to be tested in a preset driving scenario, and wherein the indicator combination comprises at least one indicator item and an expected value range of the indicator item;
obtaining, by the server, according to a scenario feature corresponding to the preset driving scenario and the indicator item, historical driving behavior information of the unmanned vehicle to be tested from pre-stored driving behavior information, wherein the scenario feature and the pre-stored driving behavior information are determined according to pre-stored traveling information, and the pre-stored traveling information is data collected by the unmanned vehicle and uploaded to the server; and obtaining, by the server, according to the historical driving behavior information, coping capability boundary information corresponding to the indicator combination, of the unmanned vehicle to be tested in the preset driving scenario;

wherein the obtaining, by the server, according to the historical driving behavior information, coping capability boundary information corresponding to the indicator combination, of the unmanned vehicle to be tested in the preset driving scenario, comprises:

processing, by the server, the historical driving behavior information by using a preset autonomous driving simulation algorithm, and obtaining a simulated value of the indicator item for a plurality of sets of simulated driving behavior information in the preset driving scenario, wherein the plurality of sets of simulated driving behavior information are driving behavior information comprising the historical driving behavior information;

determining, by the server, according to the simulated value of each of the indicator item and the expected value range, an indicator coping result corresponding to each of the indicator item for the unmanned vehicle to be tested with each of the simulated driving behavior information, wherein the indicator coping result is used to indicate whether the simulated value reaches the expected value range; and determining, by the server, according to the indicator coping result corresponding to each of the indicator item in the indicator combination, the coping capability boundary information corresponding to the indicator combination, of the unmanned vehicle to be tested in the preset driving scenario.

2. The method according to claim 1, wherein the determining, by the server, according to the indicator coping result corresponding to each of the indicator item in the indicator combination, coping capability boundary information corresponding to the indicator combination, of the unmanned vehicle to be tested in the preset driving scenario comprises:

determining, by the server, according to the indicator coping result corresponding to each of the indicator item in the indicator combination, a combined coping result corresponding to the indicator combination for the simulated driving behavior information;

determining, by the server, according to the combined coping result corresponding to the indicator combination for the simulated driving behavior information, a coping capability boundary for the simulated driving behavior information, wherein the coping capability boundary is used to divide the simulated driving behavior information into a first type of simulated driving behavior information corresponding to a combined coping result indicating successful coping, and a second type of simulated driving behavior information corresponding to a combined coping result indicating failed coping; and taking, by the server, the simulated driving behavior information corresponding to the coping capability boundary as the coping capability boundary information corresponding to the indicator combination, of the unmanned vehicle to be tested in the preset driving scenario.

3. The method according to claim 2, wherein the determining, by the server, according to the combined coping result corresponding to the indicator combination for the simulated driving behavior information, a coping capability boundary for the simulated driving behavior information, comprises:

determining, by the server, a first capability boundary for the simulated driving behavior information according to a combined coping result corresponding to the indicator combination for the simulated driving behavior information;

obtaining, by the server, from the historical driving behavior information, boundary historical driving behavior information within a preset range of the first capability boundary;

obtaining, by the server, a real coping result corresponding to the boundary historical driving behavior information, wherein the real coping result indicates a real coping situation corresponding to the indicator combination when the unmanned vehicle applies the boundary historical driving behavior information in the driving scenario;

correcting, by the server, the first capability boundary with the real coping result to obtain a second capability boundary; and taking, by the server, the second capability boundary as a coping capability boundary of the unmanned vehicle to be tested.

4. The method according to claim 1, wherein the obtaining, by the server, historical driving behavior information of the unmanned vehicle to be tested from pre-stored driving behavior information according to a scenario feature corresponding to the preset driving scenario and the indicator item, comprises:

obtaining, by the server, the pre-stored traveling information of the unmanned vehicle to be tested, wherein the pre-stored traveling information comprises pre-stored driving information and pre-stored environment information corresponding to the pre-stored driving information;

determining, by the server, according to the pre-stored traveling information, the pre-stored driving behavior information of the unmanned vehicle to be tested and pre-stored scenario information corresponding to the pre-stored driving behavior information;

clustering, by the server, the pre-stored scenario information to obtain at least one scenario feature and the pre-stored driving behavior information corresponding to each of the scenario feature, wherein the scenario feature is used to indicate a classification feature of the pre-stored scenario information of a same class;

determining, by the server, according to the indicator item, a target driving behavior type; and determining, by the server, according to the scenario feature corresponding to the preset driving scenario and the target driving behavior type, the historical driving behavior information of the unmanned vehicle to be tested from the pre-stored driving behavior information.

5. The method according to claim 4, before the obtaining, by the server, historical driving behavior information of the unmanned vehicle to be tested from pre-stored driving behavior information according to a scenario feature corresponding to the preset driving scenario and the indicator item, further comprising:

determining, by the server, according to a capability type corresponding to the coping capability boundary information to be determined, a plurality of indicator items and the scenario feature corresponding to the preset driving scenario; and determining, by the server, a set of indicator combination from the plurality of indicator items, wherein the indicator combination comprises at least one of the indicator items.

6. The method according to claim 4, wherein the pre-stored environment information comprises timestamp information;

after the obtaining, by the server, according to the historical driving behavior information, coping capability boundary information corresponding to the indicator combination, of the unmanned vehicle to be tested in the preset driving scenario, further comprising:

obtaining, by the server, according to the pre-stored environment information corresponding to the historical driving behavior information, timestamp information corresponding to the coping capability boundary information;

determining, by the server, according to the timestamp information corresponding to the coping capability boundary information, period coping capability boundary information of the unmanned vehicle to be tested in a plurality of preset time periods, wherein the time period indicates a surrounding vegetation growth stage of the preset driving scenario; and comparing, by the server, the period coping capability boundary information of the unmanned vehicle to be tested in the plurality of preset time periods, and obtaining a coping capability boundary comparison result.

7. An apparatus for determining coping capability boundary information of an unmanned vehicle, comprising: a memory, a processor, and a computer program, wherein the computer program is stored in the memory, and the processor runs the computer program to:

obtain a set of indicator combination, wherein the indicator combination is used for evaluating a coping capability of an unmanned vehicle to be tested in a preset driving scenario, and wherein the indicator combination comprises at least one indicator item and an expected value range of the indicator item;

obtain, according to a scenario feature corresponding to the preset driving scenario and the indicator item, historical driving behavior information of the unmanned vehicle to be tested from pre-stored driving behavior information, wherein the scenario feature and the pre-stored driving behavior information are determined according to pre-stored traveling information, and the pre-stored traveling information is data collected by the unmanned vehicle and uploaded to a server; and obtain, according to the historical driving behavior information, coping capability boundary information corresponding to the indicator combination, of the unmanned vehicle to be tested in the preset driving scenario;

wherein the processor runs the computer program to:

process the historical driving behavior information by using a preset autonomous driving simulation algorithm, and obtain a simulated value of the indicator item for a plurality of sets of simulated driving behavior information in the preset driving scenario, wherein the plurality of sets of simulated driving behavior information are driving behavior information comprising the historical driving behavior information;

determine, according to the simulated value of each of the indicator item and the expected value range, an indicator coping result corresponding to each of the indicator item for the unmanned vehicle to be tested with each of the simulated driving behavior information, wherein the indicator coping result is used to indicate whether the simulated value reaches the expected value range; and determine, according to the indicator coping result corresponding to each of the indicator item in the indicator combination, the coping capability boundary information corresponding to the indicator combination, of the unmanned vehicle to be tested in the preset driving scenario.

8. The apparatus according to claim 7, wherein the processor runs the computer program to:

determine, according to the indicator coping result corresponding to each of the indicator item in the indicator combination, a combined coping result corresponding to the indicator combination for the simulated driving behavior information;

determine, according to the combined coping result corresponding to the indicator combination for the simulated driving behavior information, a coping capability boundary for the simulated driving behavior information, wherein the coping capability boundary is used to divide the simulated driving behavior information into a first type of simulated driving behavior information corresponding to a combined coping result indicating successful coping, and a second type of simulated driving behavior information corresponding to a combined coping result indicating failed coping; and take the simulated driving behavior information corresponding to the coping capability boundary as the coping capability boundary information corresponding to the indicator combination, of the unmanned vehicle to be tested in the preset driving scenario.

9. The apparatus according to claim 8, wherein the processor runs the computer program to:

determine a first capability boundary for the simulated driving behavior information according to a combined coping result corresponding to the indicator combination for the simulated driving behavior information;

obtain, from the historical driving behavior information, boundary historical driving behavior information within a preset range of the first capability boundary;

obtain a real coping result corresponding to the boundary historical driving behavior information, wherein the real coping result indicates a real coping situation corresponding to the indicator combination when the unmanned vehicle applies the boundary historical driving behavior information in the driving scenario;

correct the first capability boundary with the real coping result to obtain a second capability boundary; and take the second capability boundary as a coping capability boundary of the unmanned vehicle to be tested.

10. The apparatus according to claim 7, the processor runs the computer program to:

obtain the pre-stored traveling information of the unmanned vehicle to be tested, wherein the pre-stored traveling information comprises pre-stored driving information and pre-stored environment information corresponding to the pre-stored driving information;

determine, according to the pre-stored traveling information, the pre-stored driving behavior information of the unmanned vehicle to be tested and pre-stored scenario information corresponding to the pre-stored driving behavior information;

cluster the pre-stored scenario information to obtain at least one scenario feature and the pre-stored driving behavior information corresponding to each of the scenario feature, wherein the scenario feature is used to indicate a classification feature of the pre-stored scenario information of a same class;

determine, according to the indicator item, a target driving behavior type; and determine, according to the scenario feature corresponding to the preset driving scenario and the target driving behavior type, the historical driving behavior information of the unmanned vehicle to be tested from the pre-stored driving behavior information.

11. The apparatus according to claim 10, before obtaining historical driving behavior information of the unmanned vehicle to be tested from pre-stored driving behavior information according to a scenario feature corresponding to the preset driving scenario and the indicator item, the processor further runs the computer program to:

determine, according to a capability type corresponding to the coping capability boundary information to be determined, a plurality of indicator items and the scenario feature corresponding to the preset driving scenario; and determine a set of indicator combination from the plurality of indicator items, wherein the indicator combination comprises at least one of the indicator items.

12. The apparatus according to claim 10, wherein the pre-stored environment information comprises timestamp information;

after obtaining, according to the historical driving behavior information, coping capability boundary information corresponding to the indicator combination, of the unmanned vehicle to be tested in the preset driving scenario, the processor further runs the computer program to:

obtain, according to the pre-stored environment information corresponding to the historical driving behavior information, timestamp information corresponding to the coping capability boundary information;

determine, according to the timestamp information corresponding to the coping capability boundary information, period coping capability boundary information of the unmanned vehicle to be tested in a plurality of preset time periods, wherein the time period indicates a surrounding vegetation growth stage of the preset driving scenario; and compare the period coping capability boundary information of the unmanned vehicle to be tested in the plurality of preset time periods, and obtain a coping capability boundary comparison result.

13. A non-transitory readable storage medium, wherein a computer program stored in the readable storage medium and the computer program when being executed by a processor, is used to implement the method for determining coping capability boundary information of an unmanned vehicle according to claim 1.

* * * * *